United States Patent [19]

Aoki

[11] Patent Number: 5,396,188
[45] Date of Patent: Mar. 7, 1995

[54] ACTIVE FILTER CIRCUIT

[75] Inventor: Hidehiko Aoki, Yokohama, Japan

[73] Assignee: Kabushiki Kaisha Toshiba, Kawasaki, Japan

[21] Appl. No.: 36,405

[22] Filed: Mar. 24, 1993

[30] Foreign Application Priority Data

Mar. 24, 1992 [JP] Japan .................................. 4-066061

[51] Int. Cl.⁶ .......................................... H03H 11/12
[52] U.S. Cl. ................... 327/552; 330/107; 330/288; 327/65
[58] Field of Search ............... 307/520, 521, 494, 529, 307/491; 330/306, 107, 109, 288, 252; 328/167

[56] References Cited

U.S. PATENT DOCUMENTS

| | | | |
|---|---|---|---|
| 3,924,199 | 12/1975 | Pearlman | 330/107 |
| 4,374,335 | 2/1983 | Fukahori et al. | 330/107 |
| 4,881,043 | 11/1989 | Jason | 330/107 |
| 4,922,131 | 5/1990 | Anderson et al. | 307/494 |
| 5,138,279 | 8/1992 | Kondo et al. | 330/107 |
| 5,182,477 | 1/1993 | Yamasaki et al. | 307/494 |

FOREIGN PATENT DOCUMENTS

| | | |
|---|---|---|
| 58-161413 | 9/1983 | Japan . |
| 0154418 | 7/1991 | Japan .................. 307/520 |

Primary Examiner—Timothy P. Callahan
Assistant Examiner—Dinh Le
Attorney, Agent, or Firm—Foley & Lardner

[57] ABSTRACT

An active filter circuit has a filter circuit main part including a first conductance amplifier and a second conductance amplifier in which conductances are each proportional to currents or voltages of control input signals; a first signal generation circuit for generating a current or voltage which corresponds to a first signal; a second signal generation circuit for generating a current or voltage which corresponds to a second signal; a third signal generation circuit for generating a current or voltage which corresponds to a third signal; a first control signal generation circuit for generating a first control signal in accordance with a multiplication of the first signal and a fourth signal which is a ratio of the second signal to the third signal and supplying the multiplication signal to the first conductance amplifier; and second control signal generation circuit for generating a second control signal in accordance with a multiplication of the first signal and a fifth signal which is inverse ratio of the second signal to the third signal in order to independently adjust a cut-off frequency and a gain at this frequency.

7 Claims, 5 Drawing Sheets

FIG.5 PRIOR ART ated circuit.

ACTIVE FILTER CIRCUIT

BACKGROUND OF THE INVENTION

1. Field of the Invention

The present invention relates generally to an active filter circuit and, more particularly, to a filter circuit suitable for a filter incorporated into an IC.

2. Related Art Statement

A cut-off frequency and a Q factor at this frequency are main factors for determining I/O characteristics of a filter circuit. A secondary or higher filter causes a difficulty of adjustment thereof. This point at issue will be clarified in detail referring to an illustrated circuit.

Figure 5:
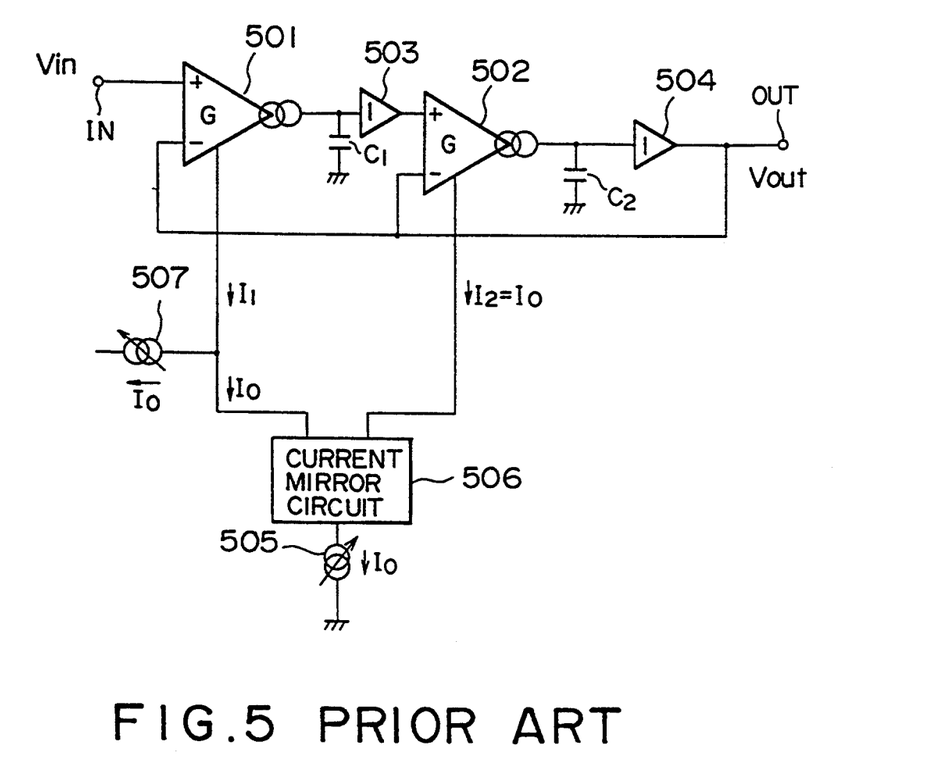
FIG. 5 is a block diagram of a conventional active filter circuit.

FIG. 5 shows a conventional example in which a secondary low-pass filter circuit is constructed of two pieces of conductance amplifiers.

Provided are transconductance amplifiers 501, 502, wherein conductances are proportional control currents I1, I2, for outputting currents proportional to input voltages. A non-inverting input terminal of the amplifier 501 is connected to an input terminal IN of the filter circuit. An inverting input terminal thereof is connected to an output terminal OUT of the filter circuit. The output terminal is connected to the other terminal of a capacitor c1 one terminal of which is grounded. A non-inverting input terminal of the amplifier 502 is connected to an output terminal of the amplifier 501. An inverting input terminal thereof is connected to the output terminal OUT of the filter circuit. The output terminal is connected to the other terminal of a capacitor c2 one terminal of which is grounded.

Further, an input terminal of a buffer 503 with a gain of "1" is connected to the output terminal of the amplifier 501. An output terminal thereof is connected to a (+) input terminal of the amplifier 502. An input terminal of a buffer 504 with a gain of "1" is connected also to the output terminal of the amplifier 502. An output terminal thereof is connected to the output terminal OUT of the filter circuit.

With this configuration, the secondary low-pass filter is constructed of: an integrating element formed of a conductance of the amplifier 501 and a capacitance of the capacitor c1; and an integrating element formed of a conductance of the amplifier 502 and a capacitance of the capacitor c2.

A current mirror circuit 506 duplicates a current I0 outputted from a constant-current source 505 to two systems. One output terminal of this current mirror circuit 506 is connected to a control input terminal of the amplifier 501. a constant-current source 507 for outputting a current IQ is connected to a connecting point therebetween. A current I1 (=I0−IQ) is supplied as a control current to the amplifier 501. The outer output terminal of the current mirror circuit 506 is connected to the control input terminal of the amplifier 502. A current I2 (=I0) is inputted as a control current to this amplifier 502.

A transfer function of a filter main part consisting of the amplifiers 501, 502, the buffers 503, 504 and the capacitors c1, c2 is, as widely known, given by the following formula:

$$T(s) = Vout/Vin \\ = (gm1\,gm2/C1\,C2)/(s^2 + (gm2/C2)s + gm1\,gm2/C1\,C2) \quad (1)$$

where Vin is the voltage at the input terminal IN, Vout is the voltage at the output terminal OUT, gm1 is the conductance of the amplifier 501, gm2 is the conductance of the amplifier 502, C1 is the capacitance of the capacitor c1, and C2 is the capacitance of the capacitor c2.

On the other hand, the following is a general equation of the transfer function of the secondary low-pass filter:

$$T(s) = \omega 0^2/(s^2 + (\omega 0/Q)s + \omega 0^2) \quad (2)$$

where $\omega 0$ is the cut-off angular frequency, this angular frequency $\omega 0$ being given such as $\omega 0 = 2\pi\,fc$ when letting fc be the cut-off frequency, and Q is the gain (dB) of the filter circuit at the cut-off frequency fc.

In the case of the secondary low-pass filter shown in FIG. 5, $\omega 0$, Q are expressed respectively by the following formulae:

$$\omega 0 = (gm1\,gm2/C1\,C2)^{\frac{1}{2}} \quad (3)$$

$$Q = ((gm1/gm2)(C2/C1))^{\frac{1}{2}} \quad (4)$$

By the way, the conductances gm1, gm2 are proportional to the control currents I1, I2, and let the proportional constants be replaced by K1, K2.

$$gm1 = K1\,I1 = K1\,(I0+IQ)$$
$$gm2 = K2\,I2 = K2\,I0 \quad (5)$$

(where IQ is the output current of the constant-current source 505, this output current being allowed to take both positive and negative values.)

The formulae (3) and (4) are rewritten by the relationship shown in this formula (5) as follows:

$$\begin{aligned}\omega 0 &= (K1\,I1\,K2\,I2/C1\,C2)^{\frac{1}{2}} \\ &= (K1\,K2/C1\,C2)^{\frac{1}{2}}(I1\,I2)^{\frac{1}{2}} \\ &= (K1\,K2/C1\,C2)^{\frac{1}{2}}((I0+IQ)I0)^{\frac{1}{2}}\end{aligned} \quad (6)$$

$$\begin{aligned}Q &= ((K1\,I1/K2\,I2)(C2/C1))^{\frac{1}{2}} \\ &= ((K1/K2)(C2/C1))^{\frac{1}{2}}(I1/I2)^{\frac{1}{2}} \\ &= ((K1/K2)(C2/C1))^{\frac{1}{2}}(1+IQ/I0)^{\frac{1}{2}}\end{aligned} \quad (7)$$

It can be known from this relationship that $\omega 0$ is proportional to $((I0+IQ)I0)^{\frac{1}{2}}$, and Q is proportional to $(1+IQ/I0)^{\frac{1}{2}}$.

Now, there is given a consideration of how $\omega 0$ and Q are adjusted. $\omega 0$ can be efficiently adjusted by varying I0, and Q can be also efficiently adjusted by varying IQ.

When I0 is changed to adjust $\omega 0$, however, it follows that Q is also varied. Besides, IQ is changed to vary Q, and $\omega 0$ is simultaneously varied. Consequently, when adjusting Q and fc of the low-pass filter to desired values, any one of fc and Q is at first shifted, and the other is next shifted. The problem is such that these operations have to be repeated.

This problem is not inherent limitedly in the low-pass filter but may be, it can be said, applied to a variety of current control active filters that constitute high-pass filters, band-pass filters, notch filters, etc.

As stated above, the conventional active filter circuit is incapable of independently adjusting the cut-off frequency and the gain at this frequency point. The adjustment thereof is time-consuming.

SUMMARY OF THE INVENTION

It is a primary object of the present invention to provide an active filter circuit capable of independently adjusting a cut-off frequency and a gain at this frequency point.

According to one aspect of the present invention, there is provided an active filter circuit comprising:

a filter circuit main part including a first conductance amplifier and a second conductance amplifier in which conductances are each proportional to currents or voltages of control input signals;

a first signal generation circuit means for generating a current or voltage which corresponds to a first signal;

a second signal generation circuit means for generating a current or voltage which corresponds to a second signal;

a third signal generation circuit means for generating a current or voltage which corresponds to a third signal;

a first control signal generation circuit for generating a first control signal in accordance with a multiplication of said first signal and a fourth signal which is a ratio of said second signal to said third signal and supplying said multiplication signal to said first conductance amplifier; and a second control signal generation circuit for generating a second control signal in accordance with a multiplication of said first signal and a fifth signal which is inverse ratio of said second signal to said third signal.

According to another aspect of the present invention, there is provided an active filter circuit comprising:

a filter circuit main part including a first conductance amplifier and a second conductance amplifier in which conductances are each proportional to currents or voltages of control input signals;

a first signal generation circuit means for generating a current or voltage which corresponds to a first signal;

a second signal generation circuit means for generating a current or voltage which corresponds to a second signal;

a third signal generation circuit means for generating a current or voltage which corresponds to a third signal;

a first control signal generation circuit for generating a first control signal in accordance with a multiplication of said first signal and a fourth signal which is a ratio of said second signal to said third signal and supplying said first control signal to said second conductance amplifier; and a second control signal generation circuit for generating a second control signal in accordance with a multiplication of said first signal and a fifth signal which is inverse ratio of said second signal to said third signal, said fifth signal being obtained from said first signal and said first control signal to said first conductance amplifier.

According to further aspect of the present invention, there is provided an active filter circuit comprising:

a filter circuit main part including a first conductance amplifier and a second conductance amplifier in which conductances are each proportional to currents or voltages of control input signals;

a first control signal generation circuit for imparting a current or voltage having a value obtained by multiplying a second variable by a first variable to said first conductance amplifier of said plurality of conductance amplifiers in the form of a control input signal; and a second control signal generation circuit for imparting a current or voltage having a value obtained by multiplying a third variable proportional to said second variable by an inverse number of said first variable to said second conductance amplifier in the form of a control input signal.

According to the present invention, $\omega 0$ is obtained by arithmetics including a multiplication with respect to first and second control signals; and Q is obtained by the arithmetics including a division with respect to the first and second control signals. Paying attention to this point, signals having values obtained by an arithmetic of two variables eliminated by either the multiplication or division thereof are generated in the form of the first and second control signals. It is therefore possible to independently adjust the cut-off frequency and the gain at this frequency point.

To be specific, as explained earlier, $\omega 0$ and Q of a secondary low-pass filter using transconductance amplifiers are expressed as shown in the formulae (6) and (7).

Now, let I1 shown in the formulae be the first control signal and I2 be the second control signal. It is assumed that a first variable is a multiplicator, and a second variable is a multiplicand in a first control signal generation circuit. It is also assumed that an inverse number of the first variable is a multiplicator, and a third variable is a multiplicand in a second control signal generation circuit. When outputs of the two are applied to the formulae (6) and (7), the first variable is eliminated in the formula (6), whereas only the second and third variables remain. The second and third variables are eliminated in the formula (7), whereas only a proportional constant thereof and the first variable remain. Hence, $\omega 0$ can be independently adjusted by making changeable the second and third variables; and Q can be also adjusted by making changeable the first variable.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Embodiments of the present invention will hereafter be described with reference to the accompanying drawings.

Figure 1:
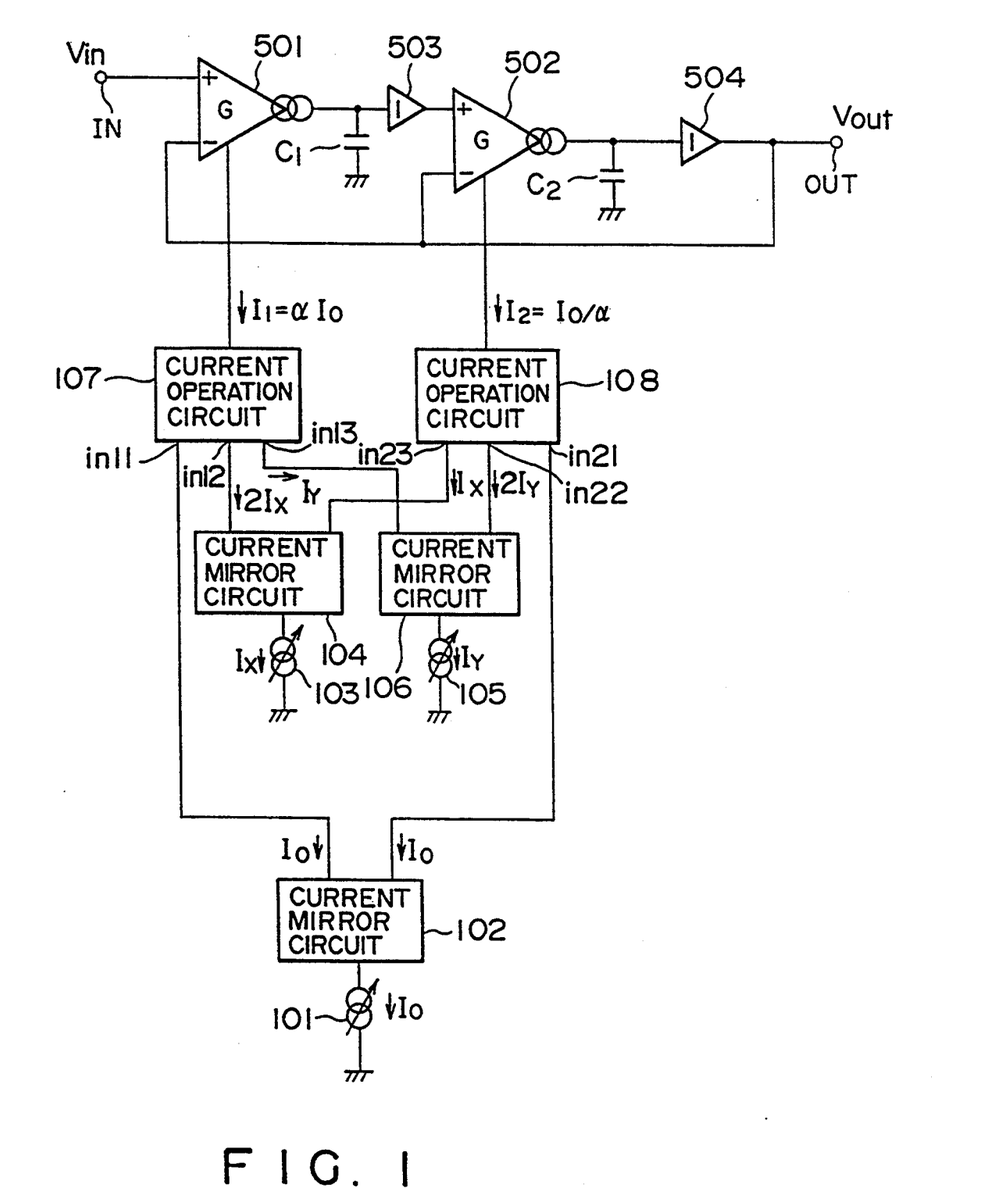
FIG. 1 is a block diagram illustrating an active filter circuit in a first embodiment of this invention.

FIG. 1 schematically illustrates circuitry of a secondary low-pass filter in a first embodiment of this invention. Note that the main part of a filter circuit has the same circuitry as that of the circuit shown in FIG. 5, and an explanation will be herein given to only different portions with an omission of a repetitive description, wherein the same circuit elements thereof are marked with the like symbols.

Paying attention first to this Figure, a variable constant-current source 101 outputs a current I0. This constant current I0 is supplied to an input terminal of a current mirror circuit 102. This current mirror circuit 102 outputs a current equal to the current I0 to two systems.

A variable constant-current source 103 outputs a current IX. This constant current IX is supplied to an input terminal of a current mirror circuit 104. This current mirror circuit 104 outputs a current that is twice as large as the current IX to one system. The circuit 104 simultaneously outputs a current equal to the current IX to the other system.

A variable constant-current source 105 outputs a current IY. This constant current IY is supplied to an input terminal of a current mirror circuit 106. This current mirror circuit 106 outputs a current that is twice as large as the current IY to one system. The circuit 106 simultaneously outputs a current equal to the current IY to the other system.

A current operation circuit 107 serving as a first control signal generation circuit has three pieces of current input terminals in11–in13. One output terminal of the current mirror circuit 102 is connected to the input terminal in11. The 2-fold current output terminal of the current mirror circuit 104 is connected to the input terminal in12. The 1-fold current output terminal of the current mirror circuit 106 is connected to the input terminal in13. This current operation circuit 107 supplies a transconductance amplifier 501 with a current $\alpha$I0 as a control current I1 that is $\alpha$-times the input current I0 given to the input terminal in11, where $\alpha$ is given by IY/IX with respect to input currents 2IX, IY to the input terminals in12, in13.

A current operation circuit 108 serving as a second control signal generation circuit has three pieces of current input terminals in21–in23. The other output terminal of the current mirror circuit 102 is connected to the input terminal in21. The 2-fold current output terminal of the current mirror circuit 106 is connected to the input terminal in22. The 1-fold current output terminal of the current mirror circuit 104 is connected to the input terminal in23. This current operation circuit 108 supplies a transconductance amplifier 502 with a current I0/$\alpha$ as a control current I2 that is 1/$\alpha$ as small as the input current I0 to the input terminal in21, where 1/$\alpha$ is given by IX/IY with respect to input currents IX, 2IY to the input terminals in22, in23.

Herein, the secondary low-pass filter part (filter circuit main part) is absolutely the same as that in FIG. 5. Hence, $\omega$0 and Q are expressed as shown in the formulae (6) and (7). Further, the outputs of the current operation circuits 107, 108 can be given by:

$$I1 = \alpha I0, \quad I2 = I0/\alpha \quad (8)$$

This formula (8) is applied to the formulae (6) and (7):

$$\omega 0 = (K1\,K2/C1\,C2)^{\frac{1}{2}} I0 \quad (9)$$

$$Q = ((K1/K2)(C2/C1))^{\frac{1}{2}} \alpha \quad (10)$$

where K1, K2 are the constant, and C1, C2 are also conceived as constants. Therefore, it follows that $\omega$0 and Q can be adjusted independently of each other by varying I0 from the formula (9) and varying $\alpha$ from the formula (10).

Note that the two output currents of the current mirror circuit 102 are herein set equal but may not necessarily be equalized, and the same effect described above can be obtained on the condition that the two outputs are both proportional to the input current. Further, $\alpha$ in the current operation circuit 107 is not necessarily equal to $\alpha$ in the current operation circuit 108. If a ratio ($\alpha$1/$\alpha$2, where $\alpha$ in the current operation circuit 107 is set to $\alpha$1, and $\alpha$ in the current operation circuit 108 is set to $\alpha$2) therebetween is fixed, the same effect can be also acquired. Further, $\omega$0 and Q are controlled by using the currents, but there is absolutely no problem if controlled by use of voltages.

Figure 2:
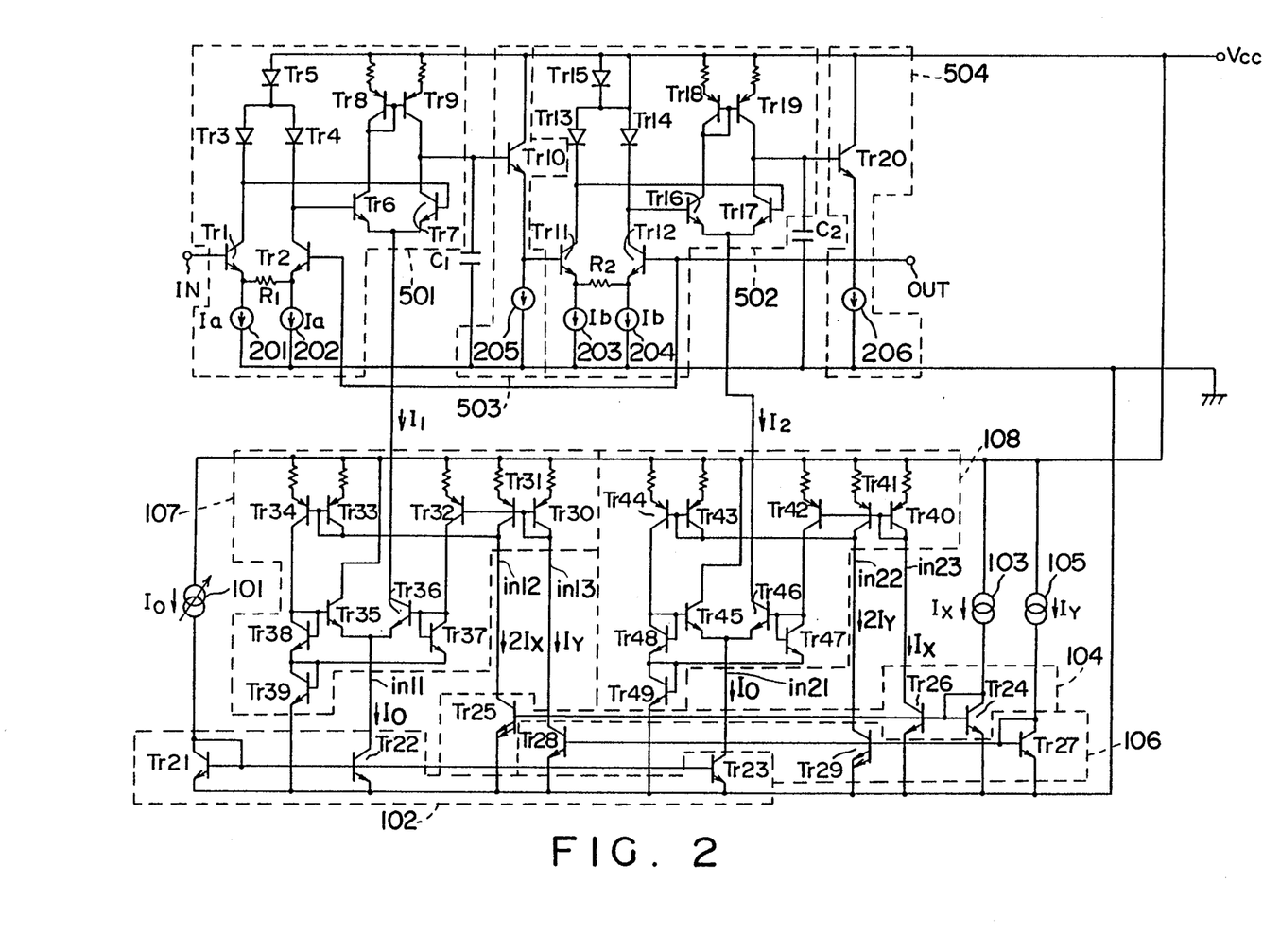
FIG. 2 is a circuit diagram fully illustrating the circuit shown in FIG. 1.

FIG. 2 shows particulars of the circuitry in FIG. 1.

Referring to this Figure, to start with, an amplifier 501 is constructed of transistors Tr1–Tr9, a resistor R1 and constant-current sources 201, 202. Among those components, the transistors Tr1–Tr5, the resistor R1 and the constant-current sources 201,202 are combined to form a logarithmic compression circuit exhibiting an input-to-output logarithmic characteristic. A base of the transistor Tr1 constitutes an input terminal IN. Logarithmic transform voltages are outputted from collectors of the transistors Tr1, Tr2. The transistors Tr8–Tr9 are combined to form an exponential expansion circuit. Collectors of the transistors Tr7, Tr9 constitute a current output terminal of the amplifier 501. Output voltages of the logarithmic compression circuit are inputted to bases of the transistors Tr6, Tr7. Currents having a linear relationship to the input voltage on the whole of the amplifier 501 are outputted from collectors of the transistors tr7, Tr9.

A buffer 503 consists of a transistor Tr10 and a constant-current source 205. A base of the transistor Tr10 forms an input terminal thereof. An emitter of the same transistor Tr10 forms an output terminal thereof. A capacitor C1 is connected between the base of this transistor Tr10 and a grounding line.

An amplifier 502 consists of transistors Tr11–Tr19, a resistor R2 and constant-current sources 203, 204. Among those components, the transistors Tr11–Tr15, the resistor R2 and the constant-current sources 203, 204 are combined to form a logarithmic compression circuit exhibiting an input-to-output logarithmic characteristic. A base of the transistor Tr11 constitutes a (+) input terminal. Logarithmic transform voltages are outputted from collectors of the transistors Tr11, Tr12. The transistors Tr18 and Tr19 are combined to form an exponential expansion circuit. Collectors of the transistors Tr17, Tr19 constitute a current output terminal of the amplifier 502. Output voltages of the logarithmic compression circuit are inputted to bases of the transistors Tr16, Tr17. Currents having a linear relationship to the input voltage on the whole of the amplifier 502 are outputted from collectors of the transistors tr17, Tr19.

A buffer 504 consists of a transistor Tr20 and a constant-current source 206. A base of the transistor Tr20 forms an input terminal thereof. An emitter of the same transistor Tr20 forms an output terminal thereof. A capacitor C2 is connected between the base of this transistor Tr20 and a grounding line.

The current mirror circuit 102 is constructed of transistors Tr21–Tr23 with their emitter areas equal to each other. An input terminal thereof is composed of a collector and a base of the transistor Tr21. An output terminal thereof is composed of collectors of the transistors Tr22, Tr23.

The current mirror circuit 104 consists of transistors Tr24–Tr26. An input terminal thereof is composed of a collector and a base of the transistor Tr24. The transistor Tr25 has an emitter area that is twice as large as that of the transistor Tr24. A collector thereof constitutes a 2-fold current output terminal. The transistor Tr26 has an emitter area equal to that of the transistor Tr24; and a collector thereof forms a 1-fold current output terminal.

The current mirror circuit 106 consists of transistors Tr27–Tr29. An input terminal thereof is composed of a collector and a base of the transistor Tr27. The transistor Tr28 has an emitter area equal to that of the transistor Tr27. A collector thereof constitutes a 1-fold current output terminal. The transistor Tr29 has an emitter area that is twice as large as that of the transistor Tr27; and a collector thereof forms a 2-fold current output terminal.

The current operation circuit 107 is constructed of transistors Tr30–Tr39.

The transistors Tr30–Tr32 among then constitute a 1-fold current mirror circuit. A collector and a base of the transistor Tr30 form an input terminal thereof and at the same time form an input terminal in13 of the current operation circuit 107. Collectors of the transistors Tr31, Tr32 constitute an output terminal of the same current mirror circuit.

The transistors Tr33, Tr34 form a 1-fold current mirror circuit. A collector and a base of the transistor Tr33 form an input terminal thereof and at the same time form an input terminal in12 of the current operation circuit 107 in combination with a collector of the transistor Tr31. The collector and the base of the transistor Tr33 are also connected to collectors of the transistors Tr25, Tr31. A collector of the transistor Tr34 constitutes an output terminal of the same current mirror circuit.

A current multiplication circuit is constructed of transistors Tr35–Tr39. Emitters of the transistors Tr35, Tr36 form an input terminal in11 of the current operation circuit 107. A collector of the transistor Tr36 constitutes an output terminal of the current operation circuit 107. This transistor Tr36 and the transistor Tr35 are combined to form a differential pair. A base of the former transistor Tr36 is biased by a diode consisting of the transistors Tr37, Tr39. A base of the latter transistor Tr35 is biased by a diode consisting of the transistors Tr38, Tr39. A collector of the transistor Tr32 is connected to a base and a collector of the transistor Tr37. A collector of the transistor Tr34 is connected to a base and a collector of the transistor Tr38.

The current operation circuit 108 is constructed of transistors Tr40–Tr49.

The transistors Tr40–Tr42 among them constitute a 1-fold current mirror circuit. A collector and a base of the transistor Tr40 form an input terminal thereof and at the same time form an input terminal in23 of the current operation circuit 108. Collectors of the transistors Tr41, Tr42 constitute an output terminal of the same current mirror circuit.

The transistors Tr43, Tr44 form a 1-fold current mirror circuit. A collector and a base of the transistor Tr43 form an input terminal thereof and at the same time form an input terminal in22 of the current operation circuit 108 in combination with a collector of the transistor Tr41. The collector and the base of the transistor TF43 are also connected to collectors of the transistors Tr29, Tr41. A collector of the transistor Tr44 constitutes an output terminal of the same current mirror circuit.

A current multiplication circuit is constructed of transistors Tr45–Tr49. Emitters of the transistors Tr45, Tr46 form an input terminal in21 of the current operation circuit 108. A collector of the transistor Tr46 constitutes an output terminal of the current operation circuit 108. This transistor Tr46 and the transistor Tr45 are combined to form a differential pair. A base of the former transistor Tr46 is biased by a diode consisting of the transistors Tr47, Tr49. A base of the latter transistor Tr45 is biased by a diode consisting of the transistors Tr48, Tr49. A collector of the transistor Tr42 is connected to a base and a collector of the transistor Tr47. A collector of the transistor Tr44 is connected to a base and a collector of the transistor Tr48.

In the thus constructed circuit, a transfer function of the secondary low-pass filter constructed of the filter circuit main part is given by:

$$T(s) = Vout/Vin = (gm1\ gm2/C1\ C2)/(s^2 + (gm2/C2)s + gm1\ gm2/C1\ C2) \quad (11)$$

However, $$gm1 = (1/(R1 + 2VT/Ia))I1/Ia$$

$$gm2 = (1/(R2 + 2VT/Ib))I2/Ib \quad (12)$$

where Vin, Vout are the voltages at the input terminal IN and at the output terminal OUT. Therefore, the following formulae can be known:

$$\omega0 = (gm1\ gm2/C1\ C2)^{\frac{1}{2}} = Ka\cdot(I1\cdot I2)^{\frac{1}{2}} \quad (13)$$

$$Q = ((gm1/gm2)(C2/C1))^{\frac{1}{2}} = Kb\cdot(I1\cdot I2)^{\frac{1}{2}} \quad (14)$$

However, $$Ka = ((1/(R1 + 2\ VT/Ia)) \times (1/(R2 + 2\ VT/Ib)) \times (1/Ia\ Ib) \times (1/C1\ C2))^{\frac{1}{2}} \quad (15)$$

$$Kb = (((R2 + 2\ VT/Ib)/(R1 + 2\ VT/Ia)) \times (Ib/Ia) \times (C2/C1))^{\frac{1}{2}} \quad (16)$$

Hence, it can be known that $\omega0$ is proportional to $(I1\cdot I2)^{\frac{1}{2}}$, and $Q$ is proportional to $(I1/I2)^{\frac{1}{2}}$.

Considering first a $V_{BE}$ loop of the transistors Tr35–Tr38, a current relationship between the transistors Tr35–Tr38 is established such as:

$$I_{C(Tr36)} = I_{C(Tr35)}\ I_{C(Tr37)}/I_{C(Tr38)} \quad (17)$$

and $$I_{C(Tr38)} = I_{C(Tr33)} = I_{C(Tr25)} - I_{C(Tr31)} = 2Ix - IY \quad (18)$$

Based on these formulae, the following formula is obtained:

$$I1 = I_{C(Tr36)} = (I0 - I_{C(Tr36)})IY/(2IX - IY)$$

$$I1 = (\tfrac{1}{2})(IY/IX)I0 \quad (19)$$

A current relationship between the transistors Tr45–Tr48 can be considered in the same way. Namely, $$I_{C(Tr46)} = I_{C(Tr45)} \; I_{C(Tr47)}/I_{C(Tr48)} \tag{17}$$

and $$I_{C(Tr48)} = I_{C(Tr43)} = I_{C(Tr29)} - I_{C(Tr41)} = 2IY - IX \tag{18}$$

Based on these formulae, it follows that the following formula is obtained:

$$I2 = I_{C(Tr46)} = (I0 - I_{C(Tr46)})IX/(2IY - IX)$$

$$I2 = (\tfrac{1}{2})(IX/IY)I0 \tag{20}$$

When applying the formulae (19), (20) to the formulae (13), (14), the result is:

$$\omega 0 = (\tfrac{1}{2})Ka \; I0 \tag{21}$$

$$Q = Kb \cdot (IX/IY) \tag{22}$$

It can be understood that only $\omega 0$ can be shifted, with Q being fixed, by varying I0 from the formula (21); and only Q can be shifted by varying IX or IY from the formula (22).

Figure 3:
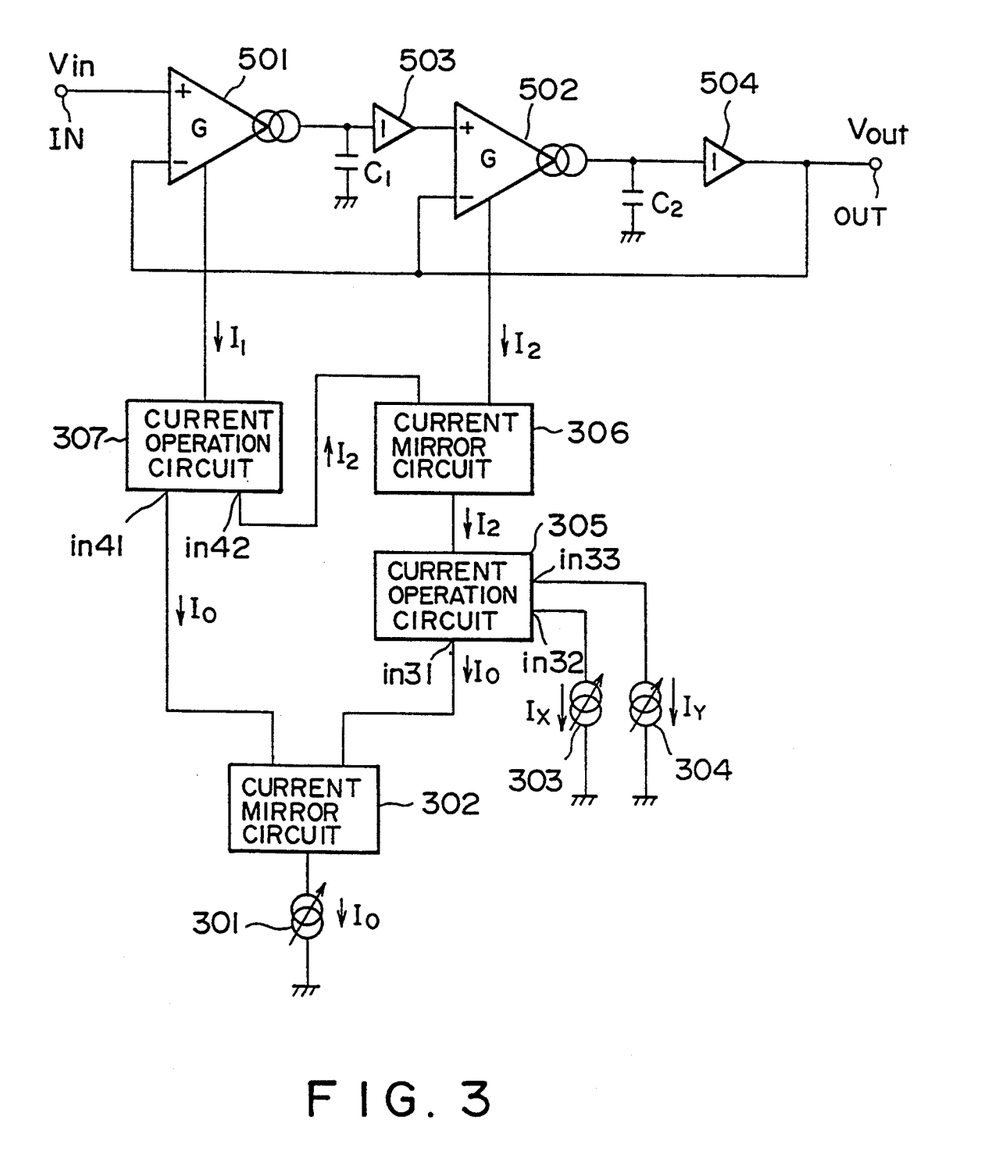
FIG. 3 is a block diagram showing an active filter circuit in a second embodiment of this invention.

Next, FIG. 3 schematically illustrates circuitry of the secondary low-pass filter in a second embodiment of the present invention. Note that the main part of the filter circuit has the same circuitry as that of the circuit shown in FIG. 5, and an explanation will be herein given to only different portions with an omission of a repetitive description, wherein the same circuit elements thereof are marked with the like symbols.

Referring to this Figure, a variable constant-current source 301 outputs the current I0. This constant current I0 is supplied to an input terminal of a current mirror circuit 302. This current mirror circuit 302 outputs a current equal to the current I0 to two systems.

A variable constant-current source 303 outputs the current IX. A variable constant-current source 304 outputs the current IY.

A current operation circuit 305 and a current mirror circuit 306 are combined to constitute a first control signal generation circuit. The current operation circuit 305 has three current input terminals in31–in33. One output terminal of the current mirror circuit 302 is connected to the input terminal in31. The constant-current source 303 is connected to the input terminal in32. The constant-current source 304 is connected to the input terminal in33. This current operation circuit 305 outputs a current $\alpha I0$ that is $\alpha$-times the input current I0 given to the input terminal in31, where $\alpha$ is given by IY/IX with respect to input currents IX, IY to the input terminals in32, in33. A 1-fold current mirror circuit 306 duplicates the current from the current operation circuit 305 to the two systems. One output terminal thereof is connected to a control input terminal of an amplifier 502.

A current operation circuit 307 cooperates with the current mirror circuit 306 to constitute a second control signal generation circuit. The current operation circuit 307 has two current input terminals in41, in42. The other output terminal of the current mirror circuit 302 is connected to the input terminal in41. The other output terminal of the current mirror circuit 306 is connected to the input terminal in42. This current operation circuit 307 supplies a transconductance amplifier 501 with a current $I0/\alpha$ as a control current I1 that is a current value obtained by dividing square of the input current I0 to the input terminal in41 by the input current I2 to the input terminal in42, in other words $1/\alpha$ multiplication of I0, where $1/\alpha$ is given by an inverse number IX/IY of the input current IY/IX to the input terminal in42.

Herein, the secondary low-pass filter of the filter circuit main part is the same as that shown in FIG. 5. Accordingly, the formulae (6) and (7) are established with respect to $\omega 0$ and Q. Further, as obvious from the above-mentioned, I1, I2 are expressed such as:

$$I1 = I0/\alpha \tag{23}$$

$$I2 = \alpha I0 \tag{24}$$

Then, when applying these formulae (23) and (24) to the formulae (6) and (7), the formulae (9) and (10) are established. Therefore, in the circuit in accordance with this embodiment also, $\omega 0$ and I0 are adjustable independently of each other by varying I0 and $\alpha$.

Incidentally, in the circuit shown in FIG. 3, the output current I1 of the current operation circuit 307 is supplied to the control input of the amplifier 501, while the output current I2 (output current I2 of the current operation circuit 305) of the current mirror circuit 306 is supplied to the control input terminal of the amplifier 502. Replacing them, however, the amplifier 501 may be supplied with the current I2, while the amplifier 502 may be supplied with the current I1. Further, the two flows of output currents of the current mirror circuits 302, 306 are equal to each other but not necessarily equalized. The effect described above is obtainable if the two outputs thereof are both proportional to the input current. Besides, the currents are herein employed for controlling 0, Q. There is, however, no problem if controlled by voltages.

Figure 4:
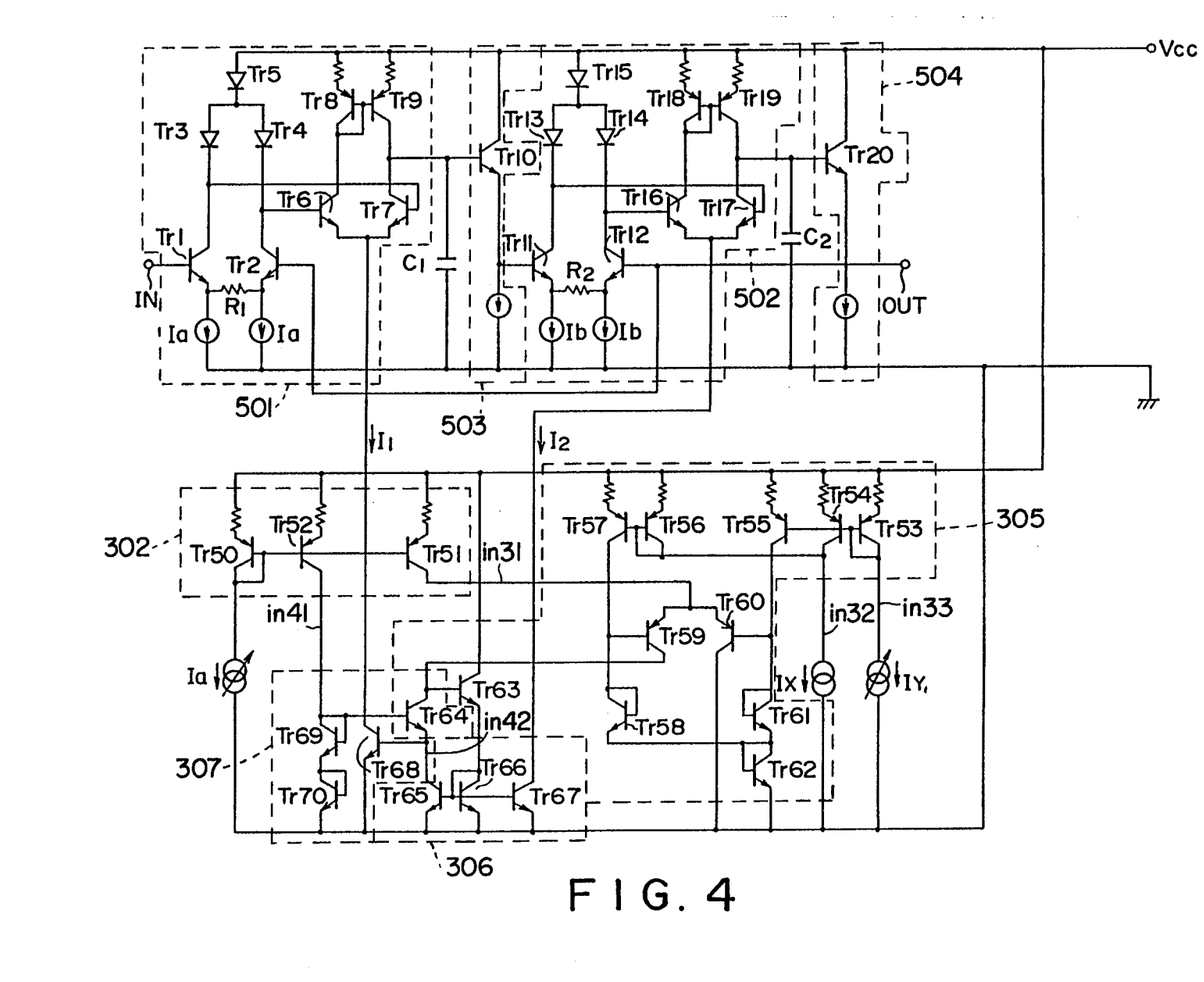
FIG. 4 is a circuit diagram fully illustrating the circuit shown in FIG. 3.

FIG. 4 shows particulars of the circuitry in FIG. 3.

Referring to this Figure, to start with, the configuration of the filter circuit main part is the same as that in FIG. 2, and hence the explanation thereof is omitted.

The current mirror circuit 302 is constructed of transistors Tr50–Tr52 with their emitter areas equal to each other. An input terminal thereof is composed of a collector and a base of the transistor Tr50. An output terminal thereof is composed of collectors of the transistors Tr51, Tr52.

The current operation circuit 305 consists of transistors Tr53–Tr66.

The transistors Tr53–Tr55 among them constitute a 1-fold current mirror circuit. A collector and a base of the transistor Tr53 form an input terminal thereof and at the same time form an input terminal in33 of the current operation circuit 305. Collectors of the transistors Tr54, Tr55 constitute an output terminal of the same current mirror circuit.

The transistors Tr56, Tr57 form a 1-fold current mirror circuit. A collector and a base of the transistor Tr56 form an input terminal thereof and at the same time form an input terminal in32 of the current operation circuit 305 in combination with a collector of the transistor Tr54. The collector and the base of the transistor Tr56 are also connected to the constant-current source 303 and a collector of the transistor Tr55. A collector of the transistor Tr57 constitutes an output terminal of the same current mirror circuit.

A current multiplication circuit is constructed of transistors Tr58–Tr62. Emitters of the transistors Tr59, Tr60 form an input terminal in31 of the current operation circuit 305. The transistors Tr59, Tr60 are combined to form a differential pair. A base of the former transistor Tr59 is biased by a diode consisting of the transistors Tr61, Tr62. A base of the latter transistor Tr60 is biased by a diode consisting of the transistors Tr58, Tr62. A collector of the transistor Tr57 is connected to a base and a collector of the transistor Tr58. A collector of the transistor Tr55 is connected to a base and a collector of the transistor Tr61.

Transistors Tr63–Tr66 form such a negative feedback loop as to equalize an emitter current of the transistor Tr63 to a collector current of the transistor Tr59. More specifically, this negative feedback loop is configured such as: transistor Tr63 base transistor Tr63 emitter transistor Tr66 collector, base transistor Tr65 base transistor Tr65 collector transistor Tr64 emitter transistor Tr64 collector. Hence, the emitter current of the transistor Tr63 is equal to the collector current of the transistor Tr59, and this turns out to be an output of the current I2.

The current mirror circuit 306 consists of transistors Tr65–Tr67. That is, the transistors Tr65, Tr66 cooperate with the transistor Tr64 and are used in common in the form of a base-to-emitter bias element of the transistor Tr63 in the current operation circuit 305. As already obvious from the negative feedback loop described above, a collector and a base of the transistor Tr66 constitute an input terminal thereof. Collectors of the transistors Tr65, Tr67 constitute an output terminal thereof. A collector of the transistor Tr67 is connected to a control current input terminal of the amplifier 502.

The current operation circuit 307 is constructed of a current multiplication circuit consisting of the transistors Tr64, Tr68–Tr70. The transistor Tr64 is herein also shared with the current operation circuit 305. An emitter of this transistor Tr64 forms an input terminal in42 of the current operation circuit 307. A collector and a base of the transistor Tr69 form an input terminal in41 of the same circuit 307. A collector of the transistor Tr68 forms an output terminal of the same circuit 307 and is connected to a control current input terminal of the amplifier 501.

In the thus constructed circuit, a transfer function of the secondary low-pass filter of the filter circuit main part is the same as that in the circuit in FIG. 2. Therefore, the formulae (11)–(16) are established as they are.

Then, in the first place, a consideration is given to a $V_{BE}$ loop of the transistors Tr58–Tr61, and the following formula is established:

$$I_{C(Tr59)} = I_{C(Tr60)}$$
$$I_{C(Tr61)}/I_{C(Tr58)} = (I0 - I_{C(Tr59)})IY/(IX-IY) \quad (25)$$

$$I_{C(Tr59)} = (IY/IX)I0 \quad (25)$$

Seeing next the circuit constructed of the transistors Tr63–Tr67, as discussed above, the negative feedback loop is configured by the transistors Tr63–Tr66. The current of these transistors are all equal. Accordingly, the current of the transistor Tr67 is equal to the current of the transistor Tr64 and, after all, equal to the current of the transistor Tr59. Namely, $$I2 = I_{C(Tr67)} = I_{C(Tr64)} = I_{C(Tr59)} = (IY/IX)I0 \quad (26)$$

Looking further at a $V_{BE}$ loop of the transistors Tr64, Tr68–Tr70, the following relationship is established:

$$I_{C(Tr70)} \, I_{C(Tr69)} = I_{C(Tr64)} \, I_{C(Tr68)} = I0^2 \quad (27)$$

From the formulae (25), (26) and (27), the following formula is obtained:

$$I1 = I_{C(Tr68)} = I0^2/I_{C(Tr64)} = (IX/IY)I0 \quad (28)$$

Based on this, when applying the formulae (26) and (28) to the formulae (13) and (14), $$\omega 0 = Ka \cdot I0 \quad (29)$$

$$Q = Kb \cdot (IX/IY) \quad (30)$$

As comprehensible by seeing this, according to the circuit shown in FIG. 4, it follows that only $\omega 0$ can be shifted by varying I0, and only Q can be shifted by varying $\alpha$.

Note that the descriptions have been all given by way of the low-pass filter in the filter circuit of this invention, however, the present invention is applicable to a variety of active filter circuits such as high-pass filters, band-pass filters, notch filters, etc. Besides, the method of adjusting $\omega 0$, Q is not particularly restricted but may involve any of manual and automatic adjustments.

As discussed above, according to the present invention, $\omega 0$ is obtained by the arithmetics including the multiplication with respect to the first and second control signals, while Q is obtained by the arithmetics including the division with respect to the first and second control signals. Paying attention to this point, the signals having the values obtained from the arithmetic of the two variables eliminated by either the multiplication or the division are generated in the form of the first and second control signals. It is therefore possible to independently adjust the cut-off frequency fc and the gain Q at this frequency fc. Accordingly, this eliminates the necessity for matching with a desired characteristic by repeating the adjustment of the two factors fc and Q several times as hitherto done. One adjustment may suffice.

It is apparent that, in this invention, a wide range of different working modes can be formed based on the invention without deviating from the spirit and scope of the invention. This invention is not restricted by its specific working modes except being limited by the appended claims.

What is claimed is:

1. An active filter circuit comprising:
   a filter circuit main part including a first conductance amplifier and a second conductance amplifier in which conductances are each proportional to currents or voltages of control input signals;
   a first signal generation circuit means for generating a current or voltage which corresponds to a first signal;
   a second signal generation circuit means for generating a current or voltage which corresponds to a second signal;
   a third signal generation circuit means for generating a current or voltage which corresponds to a third signal;
   a first control signal generation circuit for generating a first control signal in accordance with a multiplication of said first signal and a ratio of said second signal to said third signal and supplying said first control signal to said first conductance amplifier; and a second control signal generation circuit for generating a second control signal in accordance with a multiplication of said first signal and an inverse ratio of said second signal to said third signal and supplying said second control signal to said second conductance amplifier.

2. An active filter circuit comprising:

a filter circuit main part including a first conductance amplifier and a second conductance amplifier in which conductances are each proportional to currents or voltages of control input signals;

a first signal generation circuit means for generating a current or voltage which corresponds to a first signal;

a second signal generation circuit means for generating a current or voltage which corresponds to a second signal;

a third signal generation circuit means for generating a current or voltage which corresponds to a third signal;

a first control signal generation circuit for generating a first control signal in accordance with a multiplication of said first signal and a ratio of said second signal to said third signal and supplying said first control signal to said second conductance amplifier; and a second control signal generation circuit for generating a second control signal in accordance with a multiplication of said first signal and an inverse ratio of said second signal to said third signal and supplying said second control signal to said first conductance amplifier.

3. An active filter circuit comprising:

a filter circuit main part including a first conductance amplifier and a second conductance amplifier in which conductances are each proportional to currents or voltages of control input signals;

a first control signal generation circuit for providing a current or voltage in the form of a first control input signal to said first conductance amplifier, said first control input signal having a value obtained by multiplying a first variable by a second variable; and a second control signal generation circuit for providing a current or voltage to said second conductance amplifier in the form of a second control input signal, said second control input signal having a value obtained by multiplying said second variable by an inverse value of said first variable.

4. The active filter circuit according to claim 1, wherein said first signal generation circuit means includes a first constant current source and a first current mirror circuit for supplying the current corresponding to said first signal to said first control signal generating circuit and to said second control signal generating circuit, respectively, said second signal generation circuit means includes a second constant current source and a second current mirror circuit supplying the current which corresponds to said second signal, as a first supplied current, to said first control signal generating circuit and for supplying a second supplied current having a value which is double said first supplied current, to said second control signal generating circuit, and said third signal generation circuit means includes a third constant current source and a third current mirror circuit for supplying the current which corresponds to said third signal, as a third supplied current, to said second control signal generating circuit and for supplying a fourth supplied current having a value double said third supplied current, to said first control signal generating circuit.

5. The active filter circuit according to claim 4, wherein said first control signal generation circuit comprises:

a first input terminal for receiving said current corresponding to said first signal;

a second input terminal for receiving said fourth supplied current;

a third input terminal for receiving said first supplied current; and a first current operation circuit for generating said first control input signal in accordance with signals received at said first, second and third input terminals, and wherein said second control signal generation circuit comprises:

a fourth input terminal for receiving said current corresponding to said first signal;

a fifth input terminal for receiving said second supplied current;

a sixth input terminal for receiving said third supplied current; and a second current operation circuit for generating said second control input signal in accordance with signals received at said fourth, fifth and sixth input terminals.

6. The active filter circuit according to claim 2, wherein said first signal generation circuit means includes a first constant current source and a first current mirror circuit for supplying two currents, each of which corresponds to said first signal, to said first and second control signal generation circuits, respectively, said second signal generation circuit means includes a second constant current source for supplying the current corresponding to said second signal, to said first control signal generation circuit, and said third signal generation circuit means includes a third constant current source for supplying the current corresponding to said third signal, to said first control signal generation circuit.

7. The active filter circuit according to claim 6, wherein said first control signal generation circuit comprises:

a first input terminal for receiving said current corresponding to said first signal;

a second input terminal for receiving said current corresponding to said third signal;

a third input terminal for receiving said current corresponding to said second signal;

a first current operation circuit for generating said first control input signal from signals received at said first, second and third input terminals; and a second current mirror circuit receiving said first control input signal from said first current operation circuit and outputting said first control input signal to said second conductance amplifier and said second control signal generation circuit, respectively, and wherein said second control signal generation circuit comprises:

a fourth input terminal for receiving said current corresponding to said first signal;

a fifth input terminal receiving said first control input signal; and a second current operation circuit for outputting said second control input signal from signals received at said fourth and fifth input terminals.

* * * * *